(12) United States Patent
Worley

(10) Patent No.: US 6,710,376 B2
(45) Date of Patent: Mar. 23, 2004

(54) OPTO-COUPLER BASED ON INTEGRATED FORWARD BIASED SILICON DIODE LED

(76) Inventor: Eugene Robert Worley, 11 Bowditch, Irvine, CA (US) 92620

(*) Notice: Subject to any disclaimer, the term of this patent is extended or adjusted under 35 U.S.C. 154(b) by 0 days.

(21) Appl. No.: 10/233,934

(22) Filed: Sep. 3, 2002

(65) Prior Publication Data

US 2003/0042494 A1 Mar. 6, 2003

Related U.S. Application Data

(60) Provisional application No. 60/316,863, filed on Sep. 4, 2001.

(51) Int. Cl.[7] ............................................. H01L 33/00
(52) U.S. Cl. ............................ 257/92; 257/93; 257/98; 257/88; 257/226; 257/257
(58) Field of Search ............................ 257/92, 93, 98, 257/88, 80, 81–84, 226, 257, 436, 437, 449, 453

(56) References Cited

U.S. PATENT DOCUMENTS

| | | | | |
|---|---|---|---|---|
| 3,699,407 A | * | 10/1972 | Gurtler et al. | ................ 257/80 |
| 4,467,340 A | * | 8/1984 | Rode et al. | ................ 257/226 |
| 4,888,625 A | * | 12/1989 | Mueller | ................ 257/80 |
| 5,654,559 A | * | 8/1997 | Spaeth et al. | ................ 257/82 |
| 6,285,084 B1 | * | 9/2001 | Hikita et al. | ................ 257/777 |

FOREIGN PATENT DOCUMENTS

JP 04079380 A * 3/1992

* cited by examiner

Primary Examiner—Nathan J. Flynn
Assistant Examiner—Remmon R. Fordé

(57) ABSTRACT

This invention discloses the basic chip architecture and packing configuration required to build an all silicon opto-coupler in which a forward biased silicon PN junction diode is used as the LED. Construction of the LED and the detector are disclosed as well as the package chip configuration. Methods for isolating circuit structures from the LED are also disclosed so that CMOS and bipolar circuits can freely added to the transmitting chip as well as the receiving chip. Bi-directional data transmission and multi-channel operation is also shown.

16 Claims, 5 Drawing Sheets

OPTO-COUPLER BASED ON INTEGRATED FORWARD BIASED SILICON DIODE LED

CROSS-REFERENCE TO RELATED APPLICATION

This application claims the benefit of provisional application 60/316,863 filed Sep. 4, 2001.

STATEMENT REGARDING FEDERALLY SPONSORED RESEARCH OR DEVELOPMENT

Not Applicable

REFERENCE TO A MICROFICHE APPENDIX

1. Field of the Invention

This invention relates to opto-couplers used to electrically isolate signals.

2. Prior Art

Traditional opto-couplers are made using a discrete GaAs based LED and a silicon detector. In the simplest opto-couplers the detector is a single device such as a PN junction diode, a bipolar transistor, an SCR, or a Triac. Detector chips may also include circuits such as amplifiers and various types of output buffer/drivers. Moreover, an additional silicon chip can be added such as an input buffer/driver for the LED. The input signal may be, for example, a TTL type which can not directly drive the LED. Linear opto couplers can also been made which can transmit a voltage or a current level to an output from an isolated input.

The GaAs based LEDs used in opto couplers typically emit light in the deep red region of the visible spectrum where silicon PN junction diodes are efficient at converting the LED light into an electrical signal.

SUMMARY OF THE INSTANT INVENTION

This invention relates to opto-couplers which electrically isolate signals. It is the objective to show how to make an all silicon opto coupler using a forward biased silicon PN junction diode as the LED. With lattice damage added by, for example, not annealing an implant used to make the diode, the optical efficiency can be improved to make practical all silicon opto-couplers. Thus, the traditional discrete GaAs based LED used in existing opto-couplers is replaced with a silicon forward biased PN junction diode which has a lower "on" voltage (1.6V versus 0.65V for silicon). Furthermore, the forward biased silicon PN junction LED can be easily and cheaply integrated into a silicon integrated circuit using standard silicon processing techniques.

It is another object of this invention to show how a light detector capable of responding to the light produced by a forward biased silicon PN diode can integrated into silicon using standard silicon processing methods. Specifically, the light produced by a forward biased silicon PN junction diode produces light at a peak wavelength of about 1.15 $\mu$m which is poorly absorbed by silicon. Silicon has a light absorption coefficient of only 0.025% per micron at 1.15 $\mu$m. Thus, silicon PN junction diodes can not be used to detect the light emitted by a forward biased silicon PN junction diode. However, Schottky barrier diodes can detect 1.15 $\mu$m with a quantum efficiency of better than 10% and can be integrated into silicon using standard silicon integrated circuit processing. Furthermore, the methods describe herein permit multiple, bi-directional optical channels to be realized. Also, an [the] assembly technique makes use of the essentially transparent transmission of 1.15 $\mu$m light through the silicon substrate of the integrated circuit.

DESCRIPTION OF THE PREFERRED EMBODIMENT

Figure 1A:
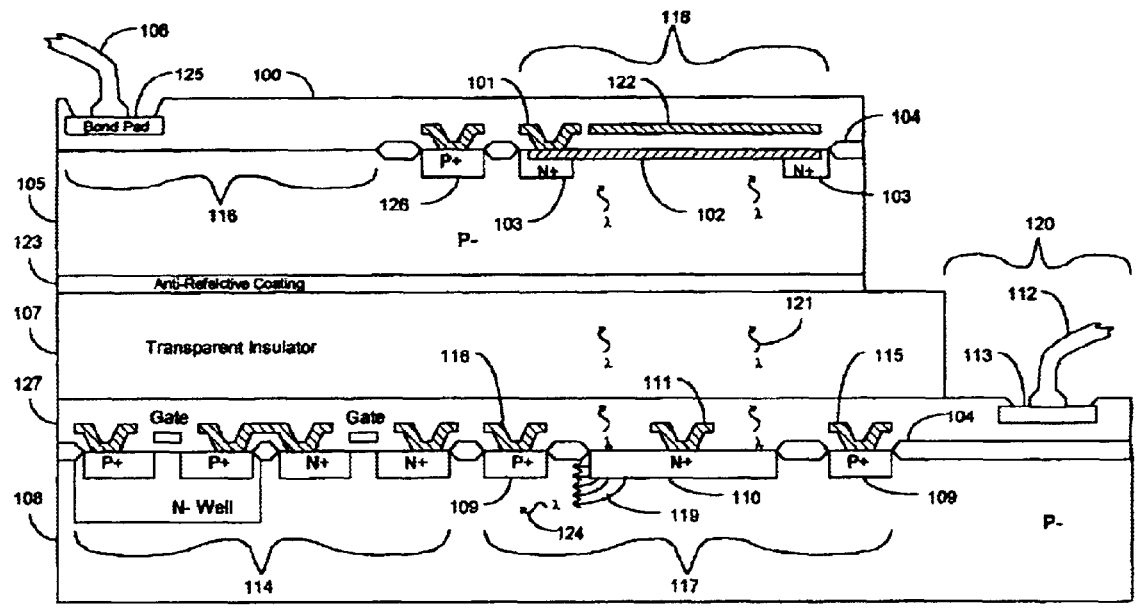
FIG. 1A Cross Section of a All Silicon Opto-Coupler in which the LED is a Forward Biased PN Junction Diode located on the bottom substrate and the light detector on the top substrate.

FIG. 1A shows the cross section of an all silicon opto-coupler using a forward biased silicon PN junction LED. The opto-coupler consists of two silicon integrated circuits formed on silicon substrates 105 and 108. Substrate 108 has a built in silicon based LED 117 along with functional circuitry 114. For the sake of illustration, an NFET and PFET are shown in the circuit 114. A second silicon integrated circuit substrate 105 has a functional circuit 116 and a built in light or photo detector 118. Separating the two substrates 105 and 108 is a transparent insulator 107. Thus, for the opto coupler shown in FIG. 1A silicon substrate 108 has the integrated light transmitting LED 117 and silicon substrate 105 has the integrated light detector 118 with a transparent insulator 107 in between. Bond pad 113 and bond wire 112 show an example of a connection between the integrated circuit of 108 and a package pin not shown. Correspondingly, bond pad 125 and bond wire 106 show an example of a connection between the integrated circuit of 105 and another package pin. Note that a protruding substrate ledge 120 is required for the bond pad 113 of substrate 108. Also note that LOCOS oxide isolation 104 is shown for both silicon integrated circuits 105 and 108. However, as can be appreciated by one normally skill in the art, trench isolation could have also been used. Deposited oxide 100 on substrate 105 and deposited oxide 127 on substrate 108 is also shown and is typical for standard integrated circuit processing.

The LED is formed using a forward biased PN junction diode with un-annealed implant dislocations used to enhance light emission (see W. Ng, M. Lourenco, R. Gwilliam, S. Ledain, G. Shao, and K. Homewood, "An efficient room-temperature silicon based light emitting diode", Nature, Vol. 410, pp. 192–194, Mar. 8, 2001). The LED diode is comprised of an N+ implant region 110 in a P type substrate 108, and a P+ implant 109 that is used to make a good electrical connection between the substrate and the anode metal terminals 115 and 116. A connection is made to the LED's N+ cathode 110 using the metal terminal 111. Because of resistance based de-biasing in the substrate, there is very little current injection 119 under the metal cathode connection 111. Thus, the light produced by the forward biasing of the N+ 110, P 108 junction is not obscured by the cathode metal 111. Most of the injection, in fact, occurs at and in the vicinity of the ends of the N+ implant 110 facing the P+ implant 109.

A forward biased N+ 110, P 108 junction emits infrared light 121 with a peak wave length of 1.15 µm. At this wavelength, the optical absorption coefficient for silicon is about 2.5 cm$^{-1}$. That is, for 10 µm of silicon, only about 0.25% of light at 1.15 µm is absorbed. Thus, silicon is not a practical detector of light with a wavelength of 1.15 µm and, in fact, can be considered transparent at 1.15 µm. To detect the light generated by the forward biased silicon junction diode 117, a Schottky barrier diode 118 is used. A Schottky barrier diode is a metal-semiconductor diode. In FIG. 1 the metal part of the diode is layer 102 and the semiconductor part is the substrate 105. Using platinum silicide (PtSi) as the metal 102, quantum efficiencies of 10% or better can be achieved. According to the Ng paper, an LED quantum efficiency of 10$^{-3}$ can be achieved for a forward biased silicon diode with implant damage. Thus, an LED to detector quantum efficiency on the order of 10$^{-4}$ is possible. That is, for every 1 mA input to the LED 0.1 µA is output from the detector.

The Schottky barrier metal 120 is generally quite thin. For PtSi this layer thickness can be about 20A (see W. Kosonocky, F. Shallcross, T. Villani and J. Groppe,: 160× 244 Element PtSi Schottky-Barrier IR-CCD Image Sensor", IEEE Trans. Electron Devices, Vol. ED-32, No. 8, pp. 1564–1573, August, 1985). Thin layers of barrier metal are used since detection quantum efficiency is improved.

An N+ band 103 around the periphery of the Schottky barrier metal 102 is used to reduce leakage current. 101 is standard interconnect layer of metal used to connect the cathode Schottky metal 102 with circuits such as an amplifier. The N+ band 103 also forms a contact pad under the metal 101 thus preventing metal 101 from punching through the thin Schottky barrier metal 102 and shorting to the substrate 105.

Not all of the light striking the Schottky barrier is absorbed. To improve quantum detection efficiency, an optional metal layer 122 can be added to reflect light not absorbed by the Schotty barrier diode 118. Thus, the light not absorbed by the first pass through the Schottky barrier will be redirected back through the barrier for a second pass via 122. 122 can be realized using an upper level of metal that is commonly found in modern processes which have many levels of metal.

Light 124 generated by the LED 117 that propagates laterally and into the active circuit area 114 should not cause any significant interference because of the poor absorption of the 1.15 µm light by the silicon providing the silicon junction areas of active devices are kept small.

For bonding convenience, note that detector integrated circuit chip 105 sits on top of the integrated circuit chip 108. This assembly configuration allows bond wires from both chips such as 106 and 112 to come in from the top. The light 121 generated by LED 117 then passes through transparent insulator 107 and through an optional anti-reflecting layer 123 before entering the bottom of the silicon substrate 105. Since silicon is a poor absorber of light with a peak wavelength of 1.15 µm, most of the light passing through the silicon substrate 105 will reach the Schottky light detecting diode 118. Also, the substrate 105 can be thinned to further reduce absorption. For a substrate thickness of 100 µm for 105 the light attenuation is 2.5%. Thinning of silicon substrates is common in the integrated circuit industry because of the need to reduce package height.

Figure 1B:
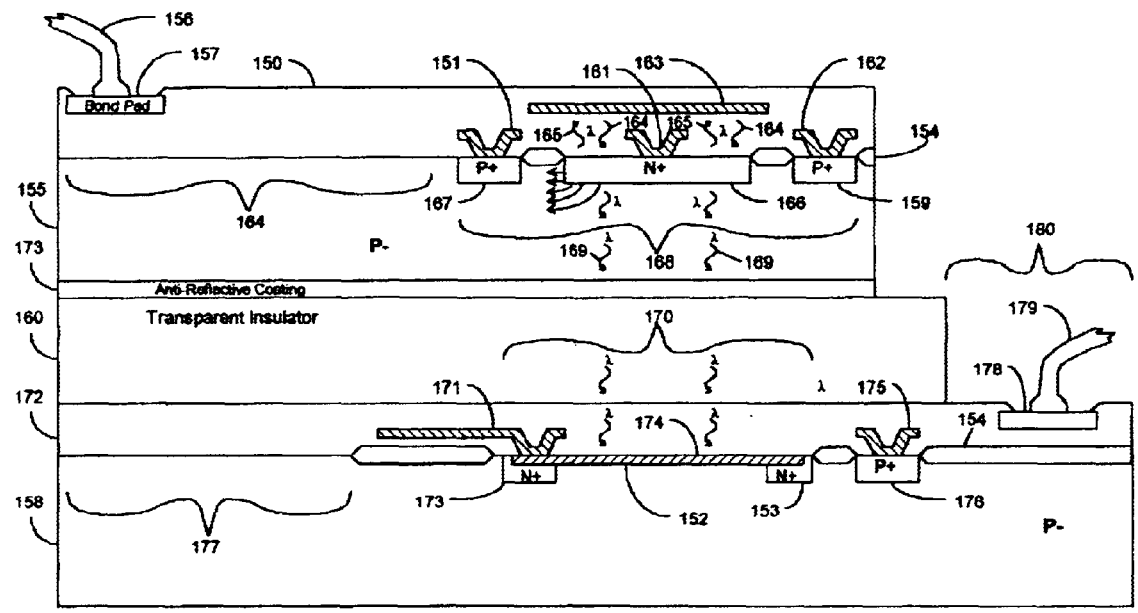
FIG. 1B Cross Section of a All Silicon Opto-Coupler in which the LED is a Forward Biased PN Junction Diode located on the top substrate and the light detector on the bottom substrate.

FIG. 1B shows a cross section of an all silicon opto-coupler in which the LED 168 is located on the top substrate 155 and the light detector 170 is located on the bottom substrate 158. Support circuitry for the opto coupler function is assumed to exist in the area 177 on substrate 158 and in the area 164 on substrate 155. Separating the two substrates 155 and 158 is a transparent insulator 160. Bonding pad 178 and bond wire 179 are an example of a connection from the circuit 177 of substrate 158 to a package not shown and bonding pad 157 and bond wire 156 are an example of a connection from the circuit 164 of substrate 155 to the package. The isolation shown for both substrates is achieved with LOCOS 154 although shallow or deep trench isolation could also be used. A deposited dielectric 150 on substrate 155 and a deposited dielectric 172 on substrate 158 are used for isolation of metal layers.

The LED 168 is formed as before using a forward biased PN junction diode. The LED 168 is comprised of an N+ implant region 166 in a P substrate 155, and P+ implants 159 and 167 are used to efficiently connect the substrate 155 to anode metal terminals 151 and 162 which are connected together. A connection is made to the LED's N+ cathode 166 using the metal terminal 161. Note that light is generated not only in the direction of the light detector 170 but also in a direction away from the light detector 170. A light reflector 163 is used to reflect the upward propagating light 165 downward 164 toward the light detector 170. The light reflector 163 can be made using an upper level of metal commonly found in silicon processes.

The light detector 170 is a Schottky barrier diode comprising a barrier metal 174 in contact with a semiconductor 158, and an N+ implant buffer 173 and 153 placed on the perimeter of the barrier metal 152. Connection to the Schottky diode's cathode 174 is made with a metal interconnect 171. The anode of the Schottky diode 170 is the P substrate 158 that is in contact with the Schottky barrier metal 152. Connection to the anode of the Schottky barrier diode is made with a P+ implant 176 and metal interconnect 175. For a good quantum efficiency the Schottky barrier metal must be thin such as 20 Å.

The operation of the coupler of FIG. 1B begins with signals coming in via bond wires such as 156 which then interact with circuitry 164. After processing by the circuitry 164, the signal causes the silicon diode LED 168 to be biased in the forward direction which then causes the LED 168 to emit light. The light is emitted both upward 165 and downward 169 into the bulk of substrate 155. The light emitted upward 165 is reflected downward 164 by the optional metal layer 163. The light then propagates through the anti-reflective coating 173, the transparent insulator 160, the deposited oxide layer 172, and finally to the light detector 170. The light detector 170 then outputs a signal in response to the light from LED 168. The output node 171 from the detector 170 feeds processing circuit 177 also located on substrate 158. The processing circuit 177 may include an amplifier for magnifying the weak signal coming from the detector 170. The processed signal from detector 170 can then be sent out of the integrated circuit of substrate 158 using one or more bond wires such as 179. Thus, isolation is achieved between the signals coming into the integrated circuit of substrate 155 and going out of integrated circuit of substrate 158. Note that by combing the elements of FIG. 1A with the elements of FIG. 1B a bi-directional opto-coupler can be realized. That is, signals can be transmitted back and forth between the electrically isolated integrated circuits.

As can be appreciated by one normally skilled in the art, the doping polarities shown in the previous example can be reversed. For example, a Schottky barrier diode can also be realized using a metal to N type semiconductor junction.

Also, the LED can be made with a P+ implant in an N doped region such as the N well associated with the construction of a PFET in a CMOS process.

Figure 2A:
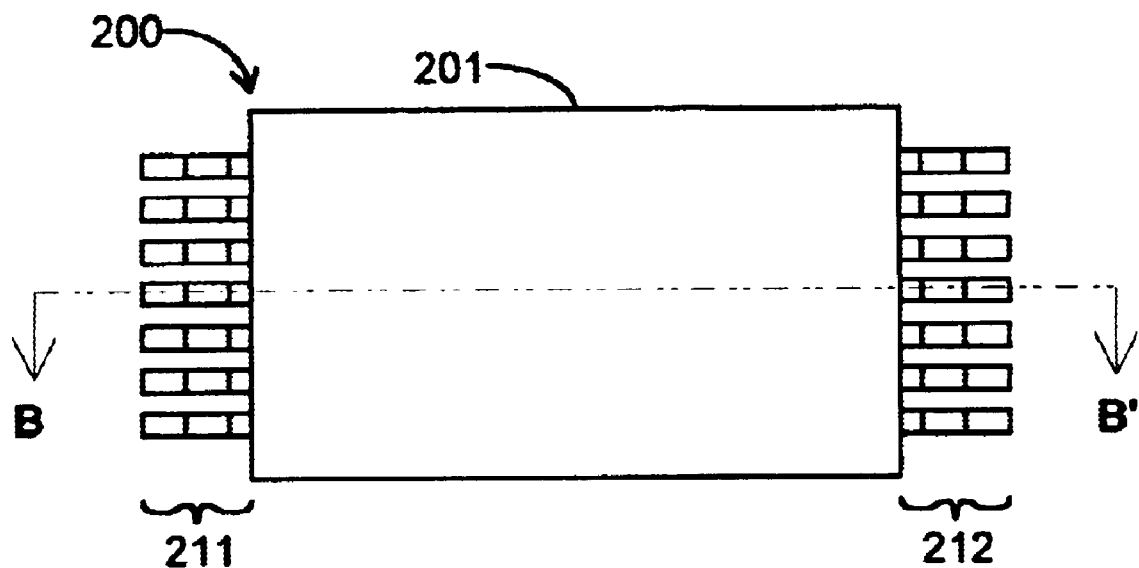
FIG. 2 shows a cross section and top view of the opto-coupler package
Figure 2B:
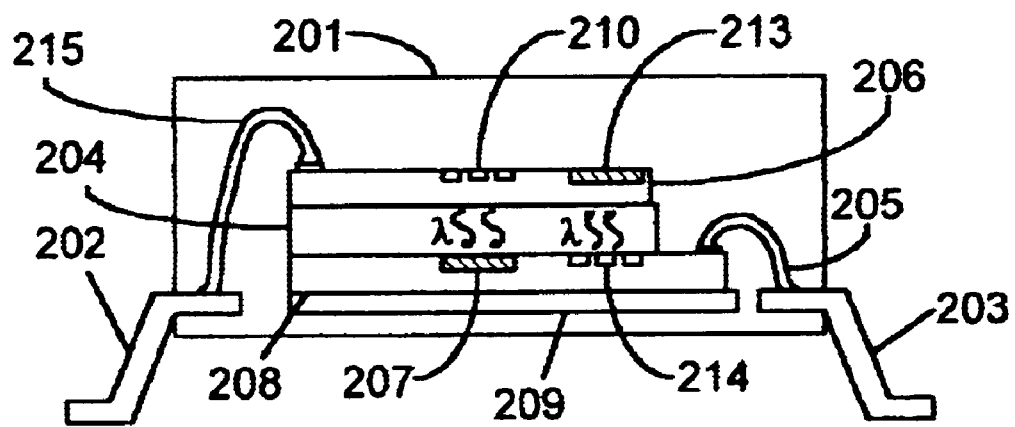

FIG. 2A shows a top view of the package 200 encapsulating the all silicon based opto-coupler and FIG. 2B shows a cross section of the opto-coupler containing two optically coupled silicon integrated circuits, 206 and 208. Package pins 211 are connected to integrated circuit 206 and package pins 212 are connected to integrated circuit 208. A transparent insulator 204 is used to separate the two integrated circuits 206 and 208. Metal plate 209 is the floor plate of the package lead frame and is used to secure the lower integrated circuit die 208 to the package lead frame. 202 is a cross section example of a package lead connected to integrated circuit 206 via bond wire 215 and 203 is an example of a package lead connected to integrated circuit 208 via bond wire 205. LED 210 and light detector 213 are associated with integrated circuit 206 and LED 214 and light detector 207 are associated with integrated circuit 208. Note that in this example there is bi-directional optical link between integrated circuits 206 and 208 with LED 210 and light detector 207 forming a first optical signal path and with LED 214 and light detector 213 forming a second, reverse optical signal path.

Figure 3:
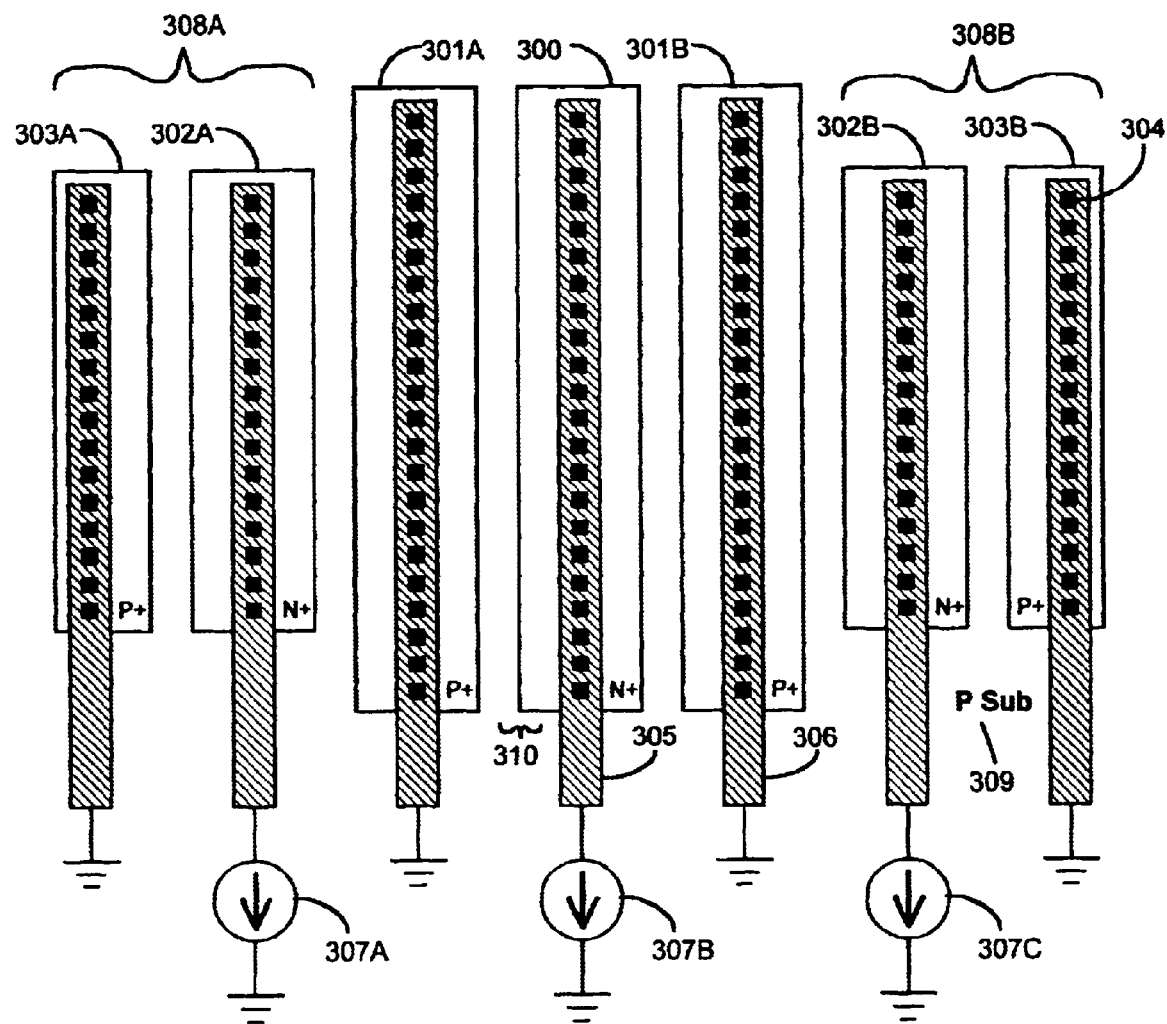
FIG. 3. Top View silicon PN junction LED using separately driven cathode implant stripes.

FIG. 3 shows a top view of the layout of a silicon LED consisting of N+ 300, 302A, 302B, and P+ 301, 303A, 303B stripes in a P substrate 108. As noted earlier, due to de-biasing, most of the carrier injection and subsequent light emission occurs at the junction edges such as boundary region 310 between the N+ implant 300 and the substrate 309 facing implant 301A. Metal lines such as 305 for the N+ implant and 306 for the P+ implant are used to connect the diode to the power terminals. Because of de-baising, little light emission occurs under the metal interconnect lines such as 305.

For the sake of illustration, the P+ implants 301A, 301B, 303A, and 303B connecting to the LED anode are grounded and the N+ implants 300, 302A, and 302B which form the diode cathode are connected to current sources. Note that each N+ implant is connected to an individual current source such as 307A, 307B, and 307C so that carrier injection and subsequent light generation is more uniform. It is well known that diode conduction has both a steep I–V slope (60 millivolts per decade change in current at 25C) and a negative temperature coefficient. These two factors tend to cause non-uniform conduction. Thus, providing current sources for each individual N+ junction helps reduce the possibility of non-uniform conduction and corresponding non-uniform light emission.

Note that end junctions 308A and 308B are made smaller than the center junction 300. This is done to make a more rounded light emission pattern. As can be appreciated by one normally skilled in the art, with more junction stripes a more circular pattern can be created by appropriate tapering of the junction stripe lengths.

Figure 4:
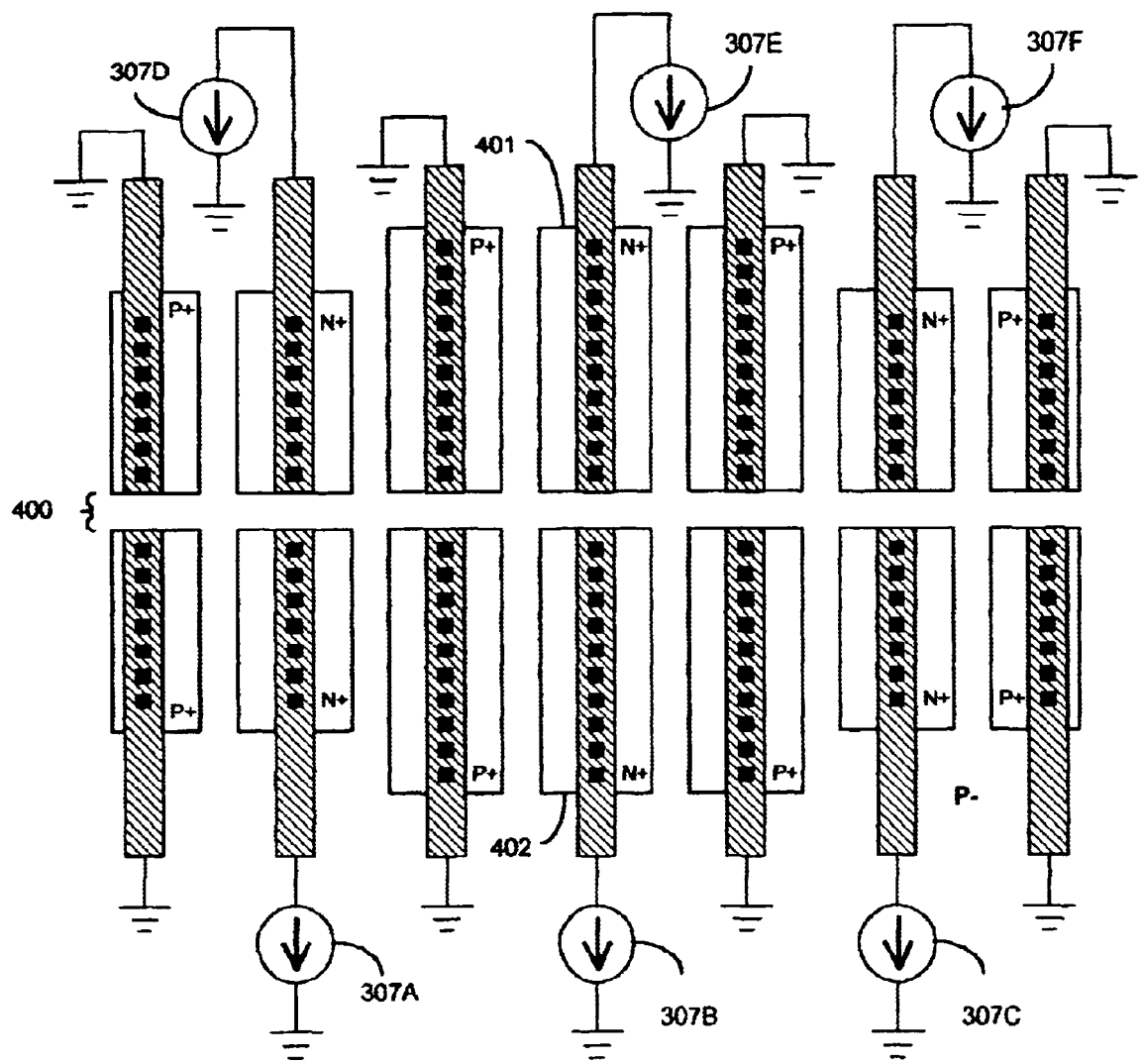
FIG. 4. Top View of All Silicon Opto-Coupler as in FIG. 3 but with finer driver drive segmentation.

FIG. 4 shows a layout variation of the LED shown in FIG. 3. In this case the implanted regions of FIG. 3 are split in two implants such as the N+ implant 300 being split into 401 and 402. This is done to further segment the implants for the sake of better current uniformity and correspondingly, better light uniformity. For the case shown in FIG. 4 three additional current drivers are introduced, 307D, 307E, and 307F. The penalty for this 2 fold increase in segmentation is slightly lower emission area due to a gap 400 between implants.

Figure 5:
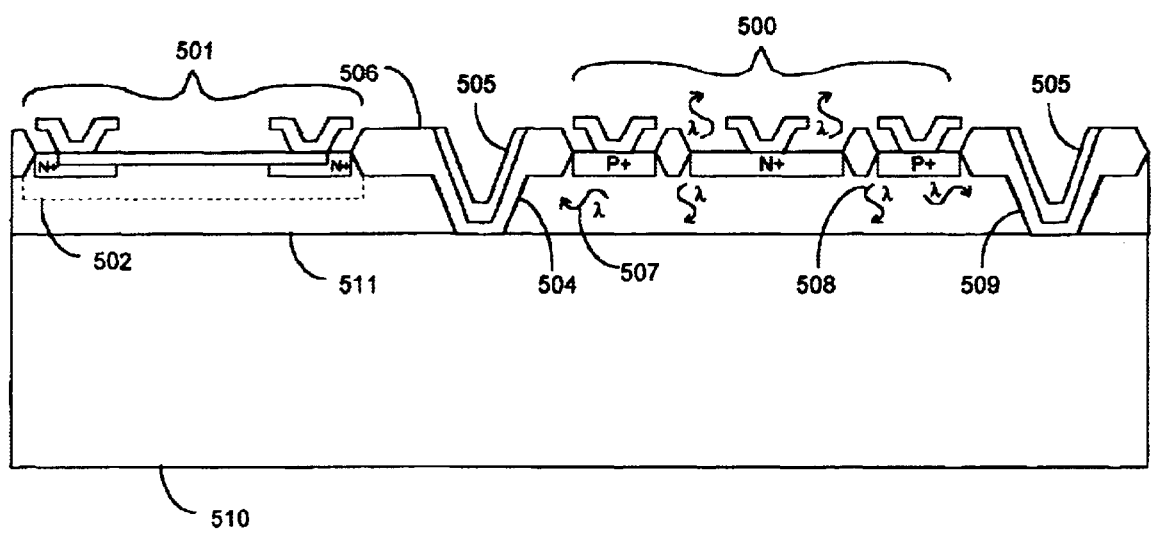
FIG. 5. Cross section of a bi-directional coupler chip showing light isolation techniques.

FIG. 5 shows the cross section of a bi-directional opto-coupler integrated circuit wherein a means for isolating the light emitted by the LED 500 from other circuitry is demonstrated. In particular, if a Schottky barrier light detector 501 is on the same chip as the LED for the purpose of bi-directional communication then it may be necessary to isolate the light detector and possibly other circuits on the substrate 510 from the light emitted by the LED 500 into the substrate 510.

Two light components that are emitted from LED 500 into the substrate 510 are shown. One is a component that is emitted latterly 507 and the other is a component that is emitted into the bulk of the substrate 508. To suppress the hole-electron pairs generated in the bulk a heavily doped substrate 510 is used with a lighter doped epitaxial layer 511. The heavy doping of the epitaxial layer will facilitate the recombination of hole-electrons produced by silicon absorption of the light.

The lateral light component 507 can cause hole-electron pairs in such critical regions as the depletion zone of the light detector diode 501. To block such light emissions, a deep trench 504 is made through the epitaxial layer 511 and down to the substrate 510. A thermal oxide 506 is then made on the surface of the silicon. Sloped trench walls can be optionally made to enhance reflection of the light 507 off of the silicon-oxide interface of the wall. Also, metal 505 can be deposited into the trench to further enhance reflection of the lateral light 507. Thus, the trench serves to reflect the lateral light 507 into the bulk of the substrate 510 and away from active surface devices such as the light detector 501.

What is claimed is:

1. An opto-coupler, comprising:
 a first silicon substrate having a top surface;
 an LED integrated on the top surface of the first substrate;
 a light transparent insulator having a top surface and a bottom surface, wherein the bottom surface of the light transparent insulator faces the top surface of the first substrate;
 a second silicon substrate having a top surface and a bottom surface, wherein the bottom surface of the second substrate faces the top surface of the light transparent insulator, and
 a light detector integrated on the top surface of the second substrate, wherein the light detector is configured to detect light emitted from the LED through the light transparent insulator and the second substrate.

2. The opto-coupler of claim 1, wherein the light detector comprises a Schottky barrier diode.

3. The opto-coupler of claim 1, further comprising a metal layer above the light detector for redirecting light back to the light detector.

4. The opto-coupler of claim 1, wherein the LED comprises a PN junction diode.

5. The opto-coupler of claim 4, wherein the first substrate is a P type substrate and the PN junction diode comprises an N+ region formed in the first substrate.

6. The opto-coupler of claim 1, further comprising a first bond pad formed on the top surface of the first substrate and a second bond pad formed on the top surface of the second substrate.

7. An opto-coupler, comprising:
 a first silicon substrate having a top surface;
 an light detector integrated on the top surface of the first substrate;
 a light transparent insulator having a top surface and a bottom surface, wherein the bottom surface of the light transparent insulator faces the top surface of the first substrate;

a second silicon substrate having a top surface and a bottom surface, wherein the bottom surface of the second substrate faces the top surface of the light transparent insulator; and an LED integrated on the top surface of the second substrate, wherein the light detector is configured to detect light emitted from the LED through the second substrate and the light transparent insulator.

8. The opto-coupler of claim 7, wherein the light detector comprises a Schottky barrier diode.

9. The opto-coupler of claim 7, further comprising a metal layer above the LED for reflecting light emitted from the LED downward.

10. The opto-coupler of claim 7, wherein the LED comprises a PN junction diode.

11. The opto-coupler of claim 10, wherein the second substrate is a P type substrate and the PN junction diode comprises an N+ region formed in the second substrate.

12. The opto-coupler of claim 7, further comprising a first bond pad formed on the top surface of the first substrate and a second bond pad formed on the top surface of the second substrate.

13. A opto-coupler, comprising:

A first silicon substrate having a top surface;

a first LED integrated on the top surface of the first substrate;

a first light detector integrated on the top surface of the first substrate;

a light transparent insulator having a top surface and a bottom surface, wherein the bottom surface of the light transparent insulator faces the top surface of the first substrate;

a second silicon substrate having a top surface and a bottom surface, wherein the bottom surface of the second substrate faces the top surface of the light transparent insulator;

a second LED integrated on the top surface of the second substrate, wherein the first light detector is configured to detect light emitted from the second LED through the second substrate and the light transparent insulator; and a second light detector integrated on the top surface of the second substrate, wherein the second light detector is configured to detect light emitted from the first LED through the light transparent insulator and the second substrate.

14. The opto-coupler of claim 13, wherein each of the first and second light detectors comprises a Schottky barrier diode.

15. The opto-coupler of claim 13, wherein each of the first and second LEDs comprises a PN junction diode.

16. The opto-coupler of claim 13, further comprising a first bond pad formed on the top surface of the first substrate and a second bond pad formed on the top surface of the second substrate.

* * * * *